(12) United States Patent
Wu et al.

(10) Patent No.: US 11,852,980 B2
(45) Date of Patent: Dec. 26, 2023

(54) TECHNIQUES FOR CORRECTION OF ABERRATIONS

(71) Applicant: Taiwan Semiconductor Manufacturing Company, Ltd., Hsinchu (TW)

(72) Inventors: Min-Cheng Wu, Taitung County (TW); Ching-Ju Huang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 49 days.

(21) Appl. No.: 17/452,831

(22) Filed: Oct. 29, 2021

(65) Prior Publication Data

US 2022/0283504 A1 Sep. 8, 2022

Related U.S. Application Data

(60) Provisional application No. 63/200,418, filed on Mar. 5, 2021.

(51) Int. Cl.
*G03F 7/00* (2006.01)
(52) U.S. Cl.
CPC ................... *G03F 7/706* (2013.01)
(58) Field of Classification Search
CPC .. G03F 7/70258; G03F 7/70358; G03F 7/706; G03F 7/70783; G03F 7/70875
See application file for complete search history.

(56) References Cited

U.S. PATENT DOCUMENTS

| | | | |
|---|---|---|---|
| 6,262,792 B1* | 7/2001 | Higashiki | G03F 7/70358 356/399 |
| 10,670,973 B2 | 6/2020 | Zou et al. | |
| 2006/0007416 A1* | 1/2006 | Murakami | G03F 9/7096 355/53 |
| 2012/0141928 A1* | 6/2012 | Ishii | G03F 7/70875 430/5 |
| 2015/0212425 A1* | 7/2015 | Chieda | G03F 7/7085 356/610 |
| 2015/0219987 A1* | 8/2015 | Kato | G03F 7/70525 355/72 |
| 2020/0166854 A1 | 5/2020 | Yagubizade et al. | |
| 2020/0184616 A1 | 6/2020 | Levesque | |

FOREIGN PATENT DOCUMENTS

| | | |
|---|---|---|
| JP | 2006078673 A | 3/2006 |
| TW | 201706724 A | 2/2017 |

* cited by examiner

*Primary Examiner* — Peter B Kim
(74) *Attorney, Agent, or Firm* — Harrity & Harrity, LLP

(57) ABSTRACT

Some implementations described herein provide an exposure tool. The exposure tool includes a reticle deformation detector and one or more processors configured to obtain, via the reticle deformation detector, reticle deformation information associated with a reticle during a scanning process for scanning multiple fields of a wafer. The one or more processors determine, based on the reticle deformation information, a deformation of the reticle at multiple times during the scanning process, and perform, based on the deformation of the reticle at the multiple times, one or more adjustments of one or more components of the exposure tool during the scanning process.

20 Claims, 9 Drawing Sheets

TECHNIQUES FOR CORRECTION OF ABERRATIONS

CROSS-REFERENCE TO RELATED APPLICATION

This Patent Application claims priority to U.S. Provisional Patent Application No. 63/200,418, filed on Mar. 5, 2021, and entitled "TECHNIQUES FOR CORRECTION OF ABERRATIONS." The disclosure of the prior Application is considered part of and is incorporated by reference into this Patent Application.

BACKGROUND

Lithography in semiconductor manufacturing (e.g., photolithography) is a process of transferring a pattern to a wafer. Lithography may include applying light through a reticle (e.g., a photomask) and onto fields of the wafer. The reticle is an apparatus that is configured with a pattern (e.g., a die layer pattern, an integrated circuit pattern, among other examples) that is transferred to the wafer during the lithography process. The reticle may include a lithography mask on which a pattern is formed, a frame to which the lithography mask or reticle is attached, and a pellicle layer to protect the pattern from damage and dust that could otherwise cause defects in the transfer of the pattern to the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
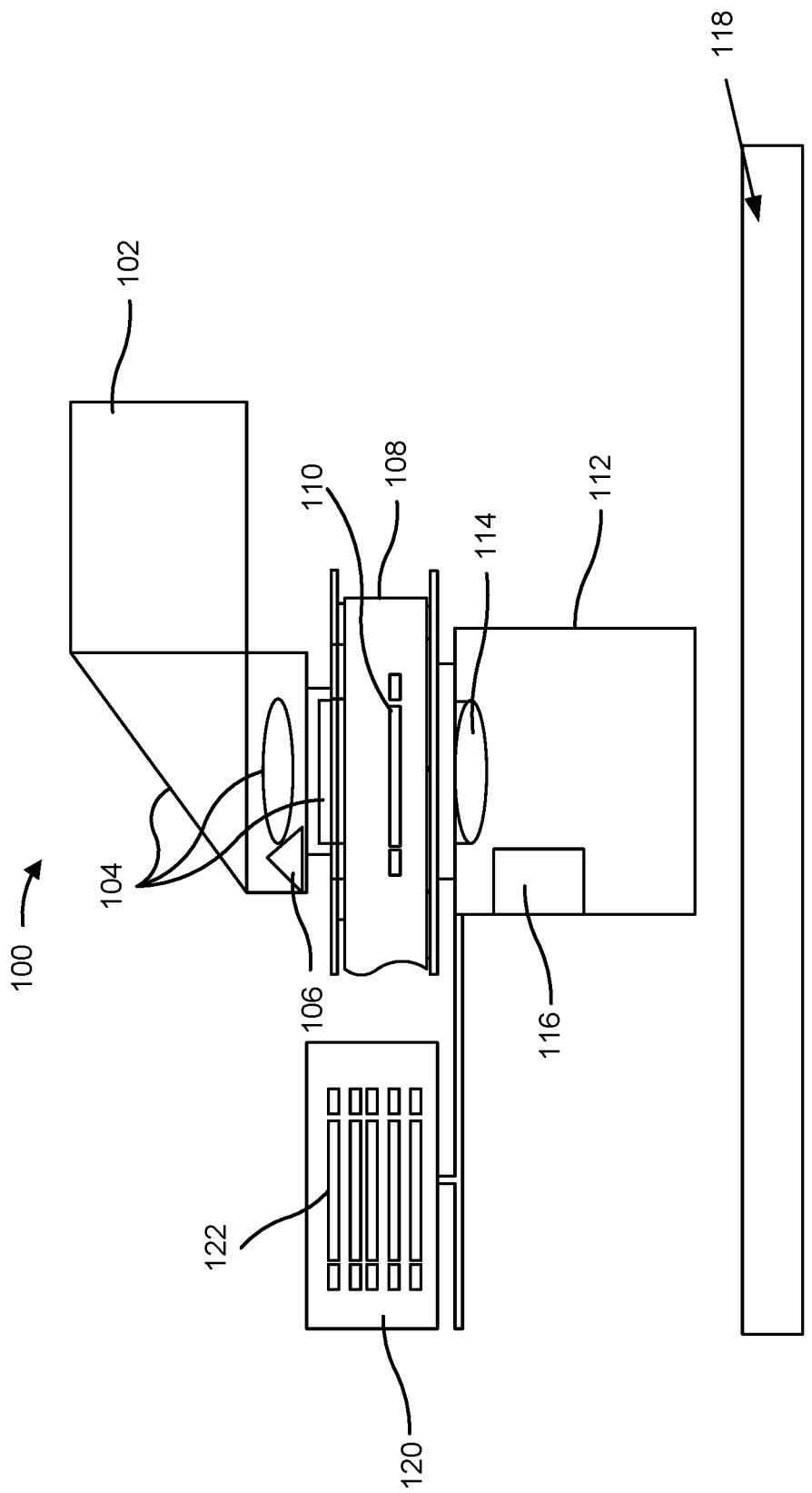
FIG. 1 is a diagram of an example of an exposure tool described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An exposure tool (e.g., an immersion exposure tool) may be used to perform lithography on the wafer. The exposure tool may operate in various exposure modes, such as a step exposure mode, a scan exposure mode, or a step-and-scan exposure mode. The exposure tool may include a wafer stage that may include a chuck, a platform, or another type of structure configured to support and secure the wafer. The wafer stage may be configured to provide various motions, such as transitional motion and/or rotational motion to support the various types of exposure modes. The wafer may include a plurality of fields having integrated circuits defined therein for one or more dies. A field includes one or more circuit dies and a frame region at a boundary area. During a lithography scanning process (e.g., an exposure operation), the substrate may be scanned (e.g., exposed to light) one field at a time. For example, the exposure tool may scan a pattern of the reticle to transfer the pattern to one field, and may then step to a next field (e.g., by moving the wafer stage) and may repeat the scanning until all fields of the substrate are exhausted.

During a lithography scanning process (e.g., an exposure operation), a reticle may change temperature. For example, during the scanning process, the reticle may change temperature based on being exposed to light (e.g., deep ultraviolet (DUV) light or extreme ultraviolet (EUV) light, among other examples). When the reticle is exposed to the light (e.g., the light passes through, is reflected by, or is absorbed by the reticle), the reticle absorbs energy from the light and converts the energy to heat. In a lithography scanning process that includes scanning several fields (e.g., 5 or more fields) of a wafer, a temperature of the reticle may vary dramatically between scans of the several fields and/or during scans of the several fields. For example, the reticle may have a lowest temperature before beginning to scan a first field and may have a highest temperature during a final portion of a scan of a last field. Additionally, or alternatively, the temperature of the reticle may fluctuate based on amounts of time between scans, during which time the reticle may cool. Based on the reticle changing temperature, the reticle may deform, which may cause aberrations in a pattern transferred from the reticle onto the wafer. The aberrations (e.g., differences between a pattern of the reticle before scanning and the pattern transferred to the wafer)

may cause manufacturing errors and/or may limit width reduction of structures within the substrate (e.g., based on limited lithography accuracy).

Some aspects described herein provide techniques and apparatuses for a correction of aberrations. In some implementations, an exposure tool may determine a deformation of a reticle, using a reticle deformation detector, during a scanning process (e.g., in real time). In some implementations, the reticle deformation detector may obtain reticle deformation information (e.g., deformation metrics and/or reticle temperatures) associated with the reticle during the scanning process (e.g., during a scan of a field of a wafer and/or between scans of different fields of a wafer, among other examples). The deformation metrics may include measurements of temperatures of the reticle during the scanning process and/or direct measurements of a real-time shape of the reticle during the scanning process, among other examples.

The exposure tool may perform one or more adjustments (e.g., to one or more components of the exposure tool) based on the deformation of the reticle. In some implementations, the one or more adjustments may be made during a scan of a field of a wafer (e.g., at a beginning of the scan) and/or between scans of fields of the wafer, among other examples. The one or more adjustments may include, for example, an adjustment to a position of a projection lens, an amount of time between scans of fields of the wafer, and/or orientations of one or more components (e.g., optical components) of the exposure tool. The one or more adjustments may be configured to reduce or eliminate an aberration that is caused by the deformation of the reticle. In this way, the exposure tool may be used to form structures having a reduced processing window based on, for example, having reduced dimensions (e.g., in a lateral direction). This may allow for the exposure tool to be used to form devices on the wafer with an improved device density.

FIG. 1 is a diagram of an example of an exposure tool 100 described herein. The exposure tool 100 includes a scanning component 102 (e.g., an illumination top module) that includes one or more optical elements 104. For example, the one or more optical elements 104 include one or more mirrors, one or more lenses, one or more apertures (e.g., apertures that refract light and/or function as a lens), and/or one or more filters, among other examples. The scanning component may include a cylinder-shaped portion for receiving light that is traveling in a lateral direction, and the one or more optical elements 104 may be configured to reflect the received light into a vertical direction. For example, a mirror of the one or more optical elements 104 may be positioned with a downward tilt at approximately 45 degrees from the lateral direction to reflect the light in a downward direction.

The exposure tool 100 includes a reticle deformation detector 106. The reticle deformation detector 106 may be disposed within the scanning component 102, adjacent to an optical element 104 of the one or more optical elements 104, and/or along a path that the scanning component 102 directs light toward the reticle. In some implementations, the reticle deformation detector 106 is stationary along the path that the scanning component 102 directs light toward the reticle. Alternatively, the reticle deformation detector 106 may be movable, such that the reticle deformation detector 106 may be moved to a detecting position (e.g., to a position with line of sight to the reticle 110 through an opening of the scanning component 102) to obtain deformation metrics (e.g., a reticle temperature and/or measurements of a shape of the reticle 110) and to an inactive position when not obtaining the deformation metrics. In some implementations, the reticle deformation detector 106 includes one or more components (e.g., sensors) that are configured to obtain measurements of deformation metrics associated with a reticle that is loaded into the exposure tool 100. The reticle deformation detector 106 is configured to obtain deformation metrics associated with scans of different fields of a wafer (e.g., wafer 118) during the scanning process. The deformation metrics may indicate a deformation of the reticle directly (e.g., via an indication of a shape and/or size of the reticle) or indirectly (e.g., via a temperature of the reticle that can be mapped to the deformation of the reticle).

The exposure tool 100 includes a reticle housing 108 that is configured to receive a reticle 110. The reticle housing 108 is configured to position the reticle 110 between the scanning component 102 and a projection lens housing 112. The projection lens housing 112 may be cylinder-shaped or another shape based on a shape of a projection lens 114 disposed within the projection lens housing 112. The exposure tool 100 includes a projection lens 114 that is configured to be adjusted within the projection lens housing 112. The projection lens 114 may be configured to be adjusted during the scanning process based on the deformation metrics associated with the scans of the different fields of the wafer during the scanning process. For example, an activation device 116 may move the projection lens 114 (e.g., vertically) to increase or decrease a distance between the projection lens 114 and the reticle 110 and/or the projection lens 114 may be rotated and/or laterally offset to modify a focus of light that enters the projection lens 114 from the reticle 110. The movement of the projection lens may be limited based on a length of the projection lens housing 112 (e.g., in a direction that is substantially aligned with a scanning direction of the scanning component 102) and/or a capability of the activation device 116.

The exposure tool 100 may be used to perform a scanning process (e.g., an exposure operation) to transfer a pattern of the reticle 110 onto a wafer 118. The scanning component 102 may receive light from a light source. The light may be configured to react with (e.g., cure) a photoresist material disposed on the wafer 118. The scanning component 102 and/or the optical elements 104 direct the light through the reticle 110 and toward the wafer 118 during a scan of a field of the wafer 118. The reticle 110 blocks a first portion of the light and passes a second portion of the light toward the field of the wafer 118 in a patterned design. A portion of the photoresist material that is exposed to the second portion of the light may cure in a way that causes the portion of the photoresist material to react differently from a remaining portion of the photoresist material when a developing agent is applied to the photoresist material. For example, portions of a positive photoresist material are configured to be removed by the developing agent if the portions of the positive photoresist material have been exposed to the second portion of the light. Alternatively, portions of a negative photoresist material are configured to resist removal by the developing agent if the portions of the negative photoresist material have been exposed to the second portion of the light. After portions of the photoresist material have been removed, an etching tool may apply an etching agent (e.g., a liquid or a plasma, among other examples) to remove portions of the wafer that are not insulated by the photoresist material.

Accuracy of filtering the light by the reticle 110 may affect dimensions of structures that the exposure tool 100 may be used to form within fields of the wafer 118. Deformation of the reticle during use (e.g., during a scanning process) may cause aberrations in a pattern of the light that passes through the reticle 110. The reticle 110 may deform during the scanning process based on reflecting and/or absorbing photons of the first portion of the light, which may cause the reticle 110 to increase in temperature. The increase in temperature may cause the reticle 110 to deform in one or more dimensions based on thermal expansion of material of the reticle 110.

The reticle deformation detector 106 may obtain deformation metrics associated with the reticle 110 during the scanning process. In some implementations, the reticle deformation detector 106 obtains the deformation metrics at multiple times during the scanning process for scanning multiple fields of a wafer. The reticle deformation detector 106 may obtain (e.g., measure) the deformation metrics during scans of fields of the wafer (e.g., during each field of the wafer and/or at a beginning of the scans of the fields of the wafer) and/or between scans of the multiple fields of the wafer (e.g., between each scan of each field and/or before beginning scans of the multiple fields, among other examples). In some implementations, the reticle deformation detector 106 may obtain the deformation metrics at a time that is closer to a beginning of a scan of a field than to a completion of a previous scan of a previous field.

Based on the deformation metrics, the exposure tool 100 determines a deformation of the reticle 110 at multiple times during the scanning process. In some implementations, the exposure tool 100 determines whether to adjust one or more components of the exposure tool 100 (e.g., to adjust the projection lens 114 and/or to replace the reticle 110 with a replacement reticle that has a lower amount of deformation, among other examples) based on the deformation of the reticle 110. For example, the exposure tool 100 may determine to adjust the one or more components based on the deformation metrics and/or the deformation of the reticle 110 satisfying a threshold (e.g., a threshold difference from a previous set of deformation metrics and/or a previous deformation of the reticle). In some implementations, the exposure tool 100 performs one or more adjustments of one or more components of the exposure tool 100 based on the deformation of the reticle 110 and/or the one or more deformation metrics. In some implementations, the exposure tool 100 (e.g., via one or more processors of the exposure tool 100) may perform one or more adjustments of one or more components of the exposure tool 100 during the scanning process. The exposure tool 100 may perform the one or more adjustments at multiple times during the scanning process (e.g., based on the deformation metrics and/or a deformation of the reticle 110 satisfying a threshold). For example, the exposure tool 100 may perform the one or more adjustments of the one or more components of the exposure tool 100 between a first scan of a first field of the wafer 118 and a second scan of a second field of the wafer 118, or perform the one or more adjustments of the one or more components of the exposure tool 100 during the first scan of the first field of the wafer 118, among other examples. In some implementations, the one or more adjustments of the one or more components of the exposure tool 100 are configured to reduce or eliminate an aberration that would have been caused by the deformation of the reticle 110 without the one or more adjustments.

In some implementations, the reticle housing 108 may receive the reticle 110 via a reticle handler 120 that stores a set of reticles including the reticle 110 and a set of replacement reticles 122. The reticle handler 120 may be configured to provide the reticle 110 based on receiving a command from one or more processors of the exposure tool 100 or from another device. In some implementations, the reticle handler 120 may be configured to replace the reticle 110 with a replacement reticle based on a deformation of the reticle 110 during a scanning process. For example, the exposure tool 100 may determine (e.g., via the reticle deformation detector 106) that the deformation of the reticle 110 satisfies a threshold, and may replace the reticle 110 with the replacement reticle 122 based on a determination that a deformation of the replacement reticle 122 is less than the deformation of the reticle 110 and/or satisfies a deformation threshold. In some implementations, the replacement reticle 122 may have a deformation that is less than the reticle 110 based on the replacement reticle 122 avoiding, or having reduced, absorption of energy from light used for the scanning process for a period of time.

As indicated above, FIG. 1 is provided as an example. Other examples may differ from what is described with regard to FIG. 1.

Figure 2:
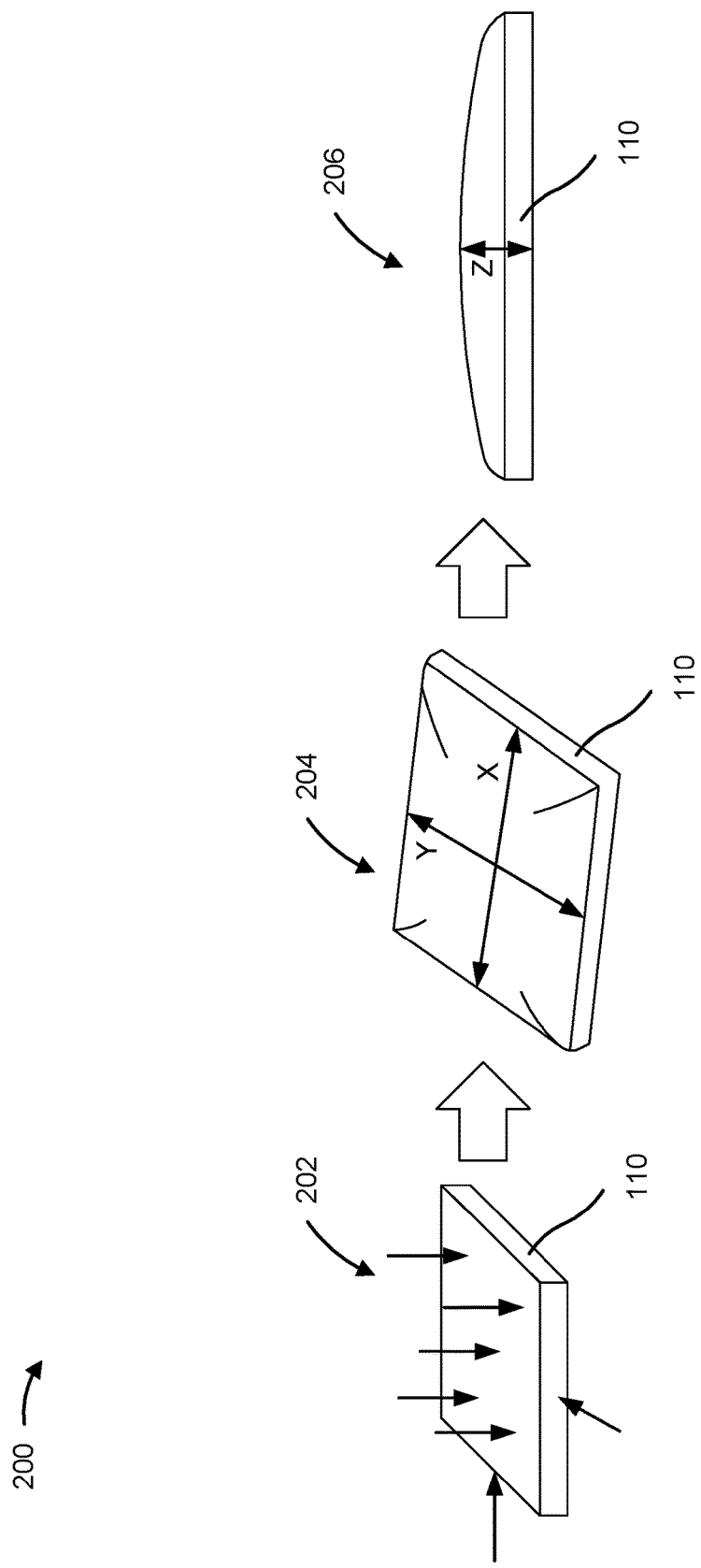
FIG. 2 is a diagram of an example of a deformation of a reticle described in connection with the exposure tool of FIG. 1.

FIG. 2 is a diagram of an example 200 of a deformation of a reticle 110 described in connection with the exposure tool of FIG. 1. The reticle 110 may be configured with a pattern of material that blocks a first portion of light that is directed to the reticle 110 in a first direction (e.g., a direction that is generally orthogonal to a surface of the reticle 110 that includes the pattern) and passes a second portion of the light that is directed to the reticle 110 in the first direction. The pattern may be associated with one or more fields of a wafer to which the pattern is to be transferred (e.g., for an etching operation).

As shown by reference number 202, the reticle 110 may be exposed to light (e.g., electromagnetic waves) from one more directions. For example, the reticle 110 may be exposed to light at a top surface of the reticle 110 via the scanning component 102 and/or the one or more optical elements 104, as described herein. In some implementations, the reticle 110 may be exposed to light at one or more side surfaces of the reticle 110.

As shown by reference number 204, the reticle 110 may deform via thermal expansion in one or more lateral directions (e.g., an X-direction and/or a Y-direction, among other examples). In some implementations, a reticle housing (e.g., reticle housing 108) may restrict expansion in the one or more lateral directions, which may cause an increase of expansion of the reticle 110 in another direction.

As shown by reference number 206, the reticle 110 may deform, via thermal expansion, in a vertical direction. In some implementations, first portions (e.g., a middle portion) of the reticle 110 may expand by an amount that is greater than expansion of second portions (e.g., outer portions) of the reticle 110. In this way, apertures that form the pattern of the reticle 110 may be curved, may be non-parallel, and/or may not be parallel to a flow of light waves from scanning component 102 to the projection lens 114. The deformation of the reticle 110 may cause an aberration to a pattern transferred to the wafer 118 without one or more adjustments to the one or more components of the exposure tool 100 during the scanning process. The deformation of the reticle 110 may change between scans of different fields of the wafer, which may cause aberrations to persist without one or more adjustments to the one or more components of the exposure tool 100 during and/or between scans of the scanning process for scanning the different fields of the wafer.

As indicated above, FIG. 2 is provided as an example. Other examples may differ from what is described with regard to FIG. 2.

Figure 3:
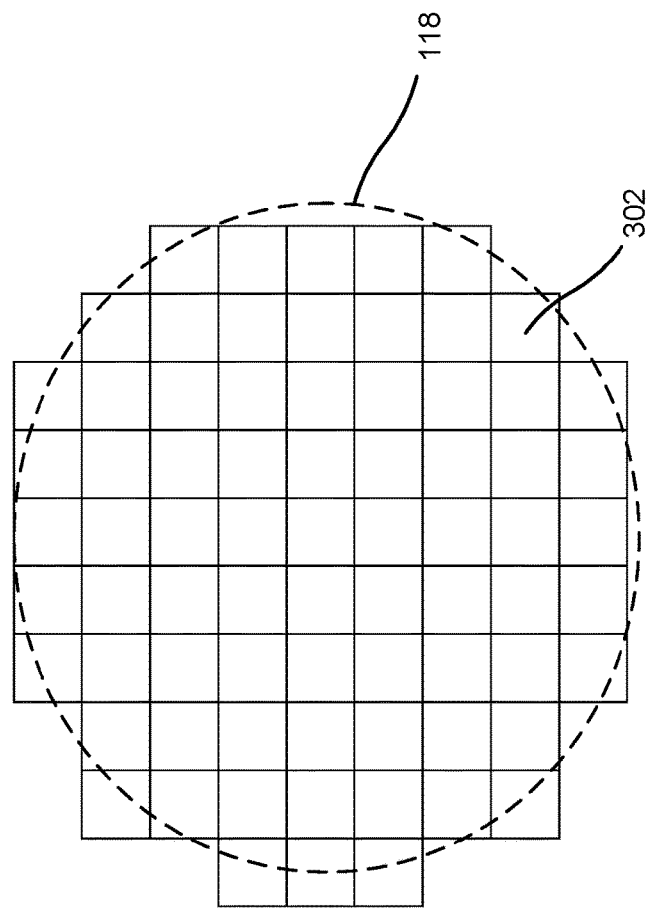
FIG. 3 is a diagram of an example of a wafer described in connection with the exposure tool of FIG. 1.

FIG. 3 is a diagram of an example 300 of a wafer 118 described in connection with the exposure tool of FIG. 1. As shown in example 300, the wafer 118 may be configured with multiple fields 302 (e.g., 92 fields). In some implementations, the fields 302 may be logical fields and/or may not be physically delineated portions of the wafer 118 during one or more operations of a manufacturing process. In some implementations, a manufacturing process includes performing a scanning process to scan multiple fields 302 of the wafer 118. In some implementations, the manufacturing process includes scanning fewer than all of the multiple fields 302 of the wafer 118. During a scanning process, the reticle may cool between scans of consecutive fields and may heat during scans of the multiple fields. In some implementations, an amount of cooling may be different between consecutive scans based on, for example, an amount of time between the consecutive scans (e.g., based on an amount of time needed for an exposure tool to move between fields associated with the consecutive scans), a temperature of the reticle between the consecutive scans (e.g., when at a high temperature, the reticle may cool more quickly), or a temperature of the exposure tool (e.g., when the exposure tool is at a high temperature, the reticle may cool more slowly), among other examples.

In some implementations, the manufacturing process includes scanning a first set of the multiple fields 302 of the wafer 118 using a first reticle and scanning a second set of the multiple fields 302 of the wafer 118 using a second reticle. In some implementations, the first set of the multiple fields 302 may be intended to have a same first pattern transferred thereon and the second set of the multiple fields 302 may be intended to have a same second pattern transferred thereon, where the first pattern is different from the second pattern. Based on determining deformation of the reticle 110 and correcting for the deformation of the reticle 110 at multiple times during the scanning process, the exposure tool 100 may improve a uniformity of the first set of the multiple fields 302 and a uniformity of the second set of the multiple fields 302.

As indicated above, FIG. 3 is provided as an example. Other examples may differ from what is described with regard to FIG. 3.

Figure 4:
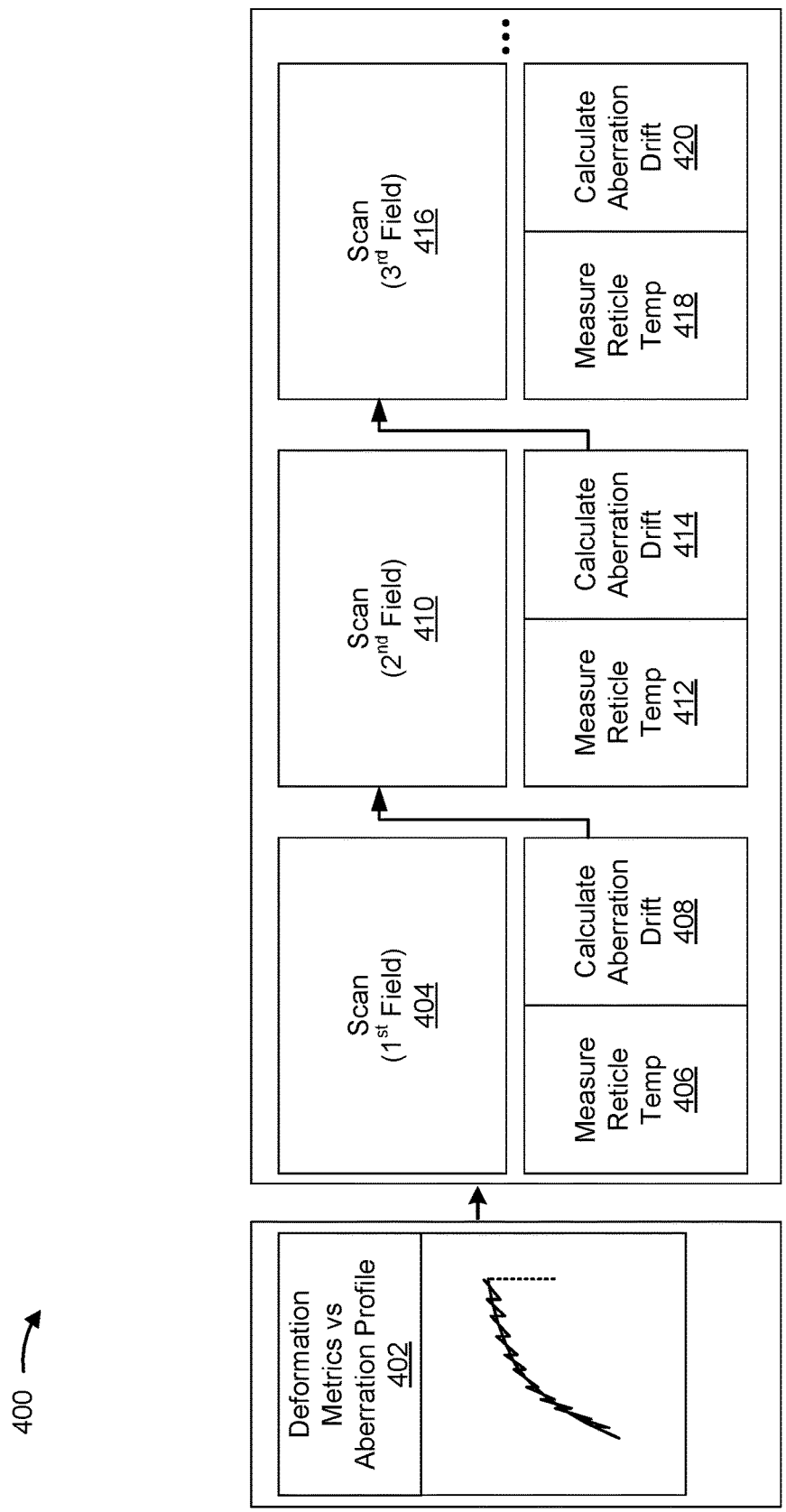
FIG. 4 is a diagram of an example of correcting aberrations described herein for use with the exposure tool of FIG. 1.

FIG. 4 is a diagram of an example 400 of correcting aberrations described herein for use with the exposure tool 100 of FIG. 1. The exposure tool 100 may perform the correction of the aberrations, as described herein. In some implementations, the exposure tool 100 is configured with a reticle deformation detector 106 (e.g., a reticle temperature sensor), as described above.

As shown by reference number 402, the exposure tool 100 may receive a mapping of reticle temperatures (e.g., temperatures of the reticle 110) to aberration profiles. The mapping may indicate an amount of aberration (e.g., a blurring and/or error of a pattern of a reticle when transferred to a field of a wafer 118) and/or may be associated with one or more adjustments to one or more components of the exposure tool 100 to correct for an associated deformation of the reticle 110 that is expected to be caused by the reticle temperatures.

The exposure tool 100 may perform a scan 404 (e.g., an exposure) of a first field of the wafer 118. During the scan 404 of the first field and/or after the scan 404 of the first field, the exposure tool 100 measures a reticle temperature 406 associated with the reticle 110. The exposure tool 100 calculates an aberration drift 408 based on the measurement of the reticle temperature 406. The aberration drift 408 may indicate a change of an aberration that would be caused by the deformation of the reticle 110 without one or more adjustments to one or more components of the exposure tool 100. The aberration drift 408 may indicate an amount of additional adjustment that may be made by the exposure tool 100 to correct for a change of the aberration that occurred during the scan 404 of the first field.

The exposure tool 100 may perform a scan 410 (e.g., an exposure) of a second field of the wafer 118. During the scan 410 of the second field and/or after the scan 410 of the second field, the exposure tool 100 measures a reticle temperature 412 associated with the reticle 110. The exposure tool 100 calculates an aberration drift 414 based on the measurement of the reticle temperature 412. The aberration drift 414 may indicate an amount of additional adjustment that may be made by the exposure tool 100 to correct for a change of the aberration that occurred during the scan 410 of the second field.

The exposure tool 100 may perform a scan 416 (e.g., an exposure) of a third field of the wafer 118. During the scan 416 of the third field and/or after the scan 416 of the third field, the exposure tool 100 measures a reticle temperature 418 associated with the reticle 110. The exposure tool 100 calculates an aberration drift 420 based on the measurement of the reticle temperature 418. The aberration drift 420 may indicate an amount of additional adjustment that may be made by the exposure tool 100 to correct for a change of the aberration that occurred during the scan 416 of the third field.

In some implementations, the exposure tool 100 continues scanning fields of the wafer 118, measuring reticle temperatures during and/or between scans of the fields of the wafer 118, and/or calculating aberration drifts associated with the deformation metrics. In some implementations, the exposure tool 100 performs one or more adjustments to one or more components of the exposure tool 100 during the scanning process (e.g., during scans and/or between scans) based on the aberration drifts, as described herein.

As indicated above, FIG. 4 is provided as an example. Other examples may differ from what is described with regard to FIG. 4.

Figure 5:
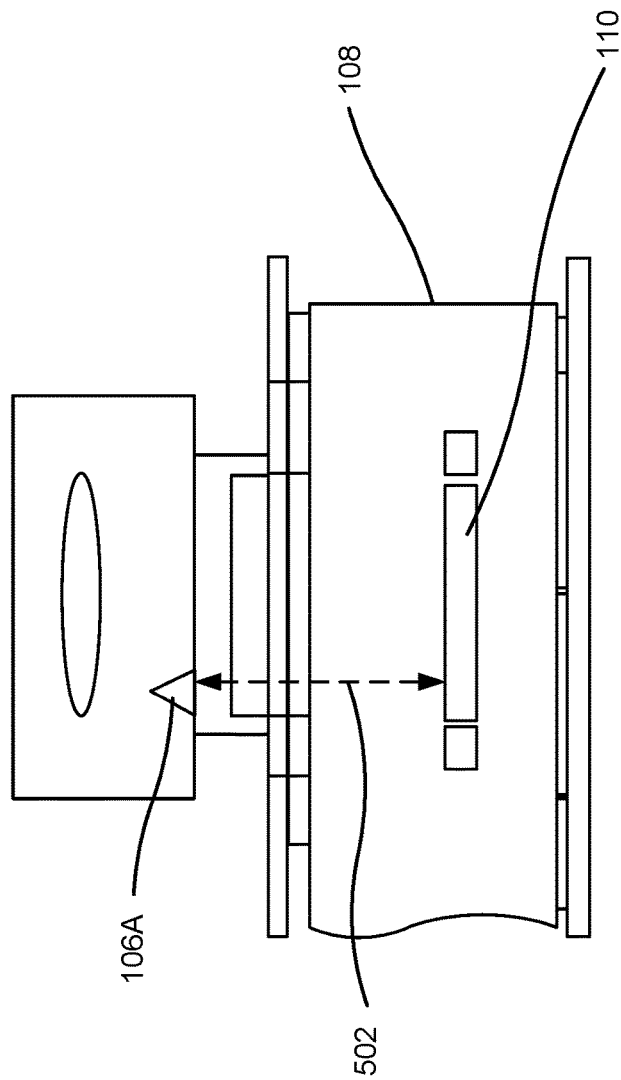
FIG. 5 is a diagram of an example of a portion of an exposure tool described in connection with the exposure tool of FIG. 1.

FIG. 5 is a diagram of an example 500 of a portion of an exposure tool described in connection with the exposure tool 100 of FIG. 1. As shown by example 500, the reticle deformation detector 106 may include a reticle temperature sensor 106A configured to measure 502 a temperature of a reticle 110 during a scanning process. The reticle temperature sensor 106A may include, for example, a non-contact thermometer.

In some implementations, the temperature of the reticle 110 is associated with a deformation of the reticle 110. The exposure tool 100 may estimate the deformation of the reticle 110 based on the temperature of the reticle 110 during the scanning process.

In some implementations, the reticle temperature sensor 106A is positioned on, or adjacent to, the scanning component 102 that is configured to direct light through the reticle 110 and toward the wafer 118. For example, the reticle temperature sensor 106A may be disposed on, or adjacent to, an optical element 104 of the scanning component 102. Additionally, or alternatively, the reticle temperature sensor 106A may be substantially aligned with a scanning direction of the scanning component 102 (e.g., a direction of a flow of light toward the wafer 118).

The exposure tool 100 may determine an aberration drift based on temperatures of the reticle 110 as measured by the reticle temperature sensor 106A. The aberration drift may indicate a change of an aberration (e.g., based on the deformation of the reticle) that has occurred since a previous measurement and/or since a previous adjustment to the one or more components of the exposure tool 100. The exposure tool 100 determines one or more modifications to apply to the one or more components of the exposure tool 100 to compensate for the aberration drift.

As indicated above, FIG. 5 is provided as an example. Other examples may differ from what is described with regard to FIG. 5.

Figure 6:
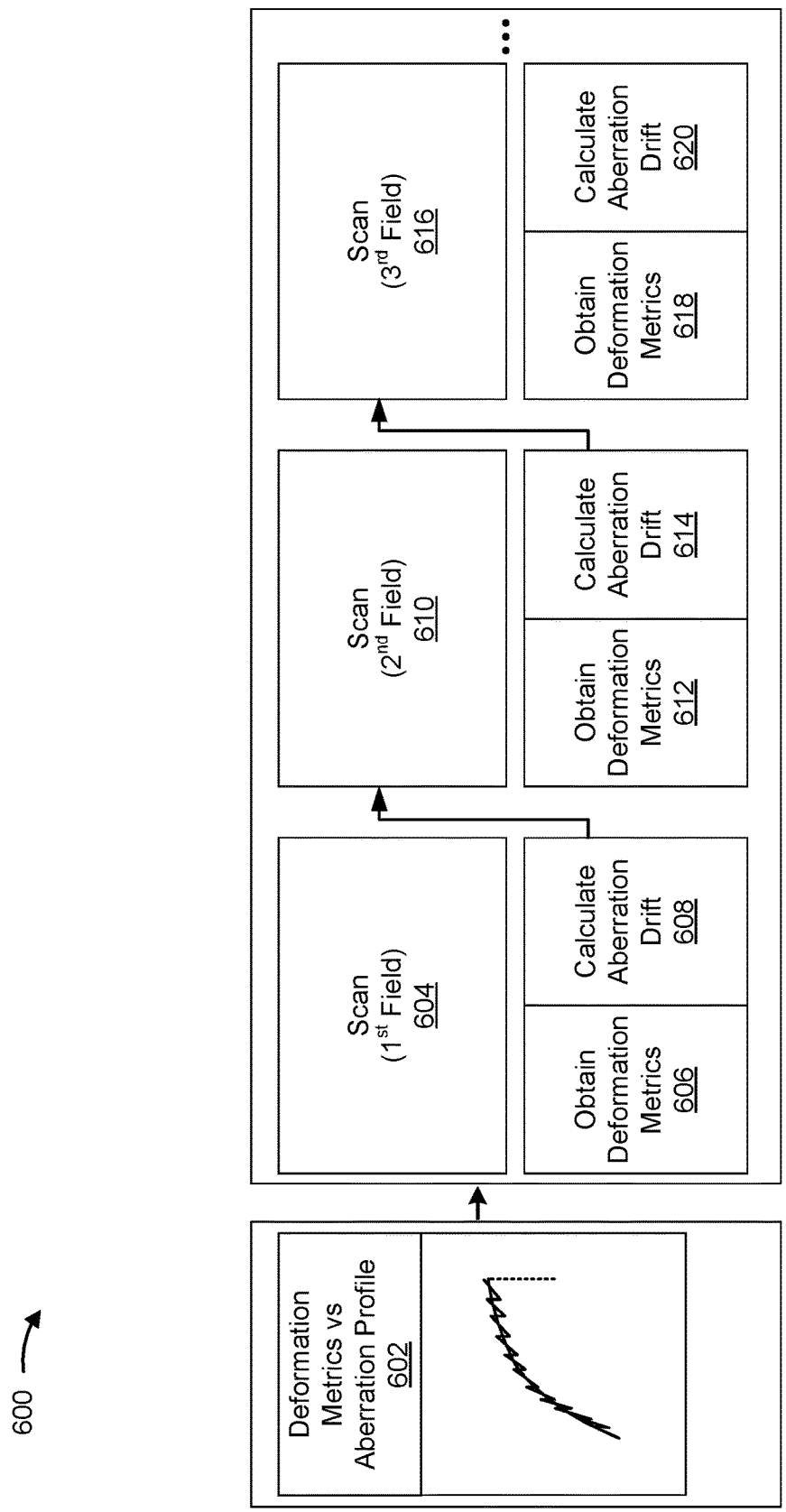
FIG. 6 is a diagram of an example of a portion of an exposure tool described in connection with the exposure tool of FIG. 1.

FIG. 6 is a diagram of an example 600 of correcting aberrations described herein for use with the exposure tool 100 of FIG. 1. The exposure tool 100 may perform the correction of the aberrations, as described herein. In some implementations, the exposure tool 100 is configured with a reticle deformation detector 106 (e.g., an electromagnetic wave-based scanner), as described above.

As shown by reference number 602, the exposure tool 100 may receive a mapping of deformation metrics (e.g., scans of s surface of the reticle 110) to aberration profiles. The mapping may indicate an amount of aberration (e.g., a blurring and/or error of a pattern of a reticle when transferred to a field of a wafer 118) and/or may be associated with one or more adjustments to one or more components of the exposure tool 100 to correct for an associated deformation of the reticle 110 that is expected to be caused by the deformation metrics.

The exposure tool 100 may perform a scan 604 (e.g., an exposure) of a first field of the wafer 118. During the scan 604 of the first field and/or after the scan 604 of the first field, the exposure tool 100 obtains deformation metrics 606 associated with the reticle 110. The exposure tool 100 calculates an aberration drift 608 based on the deformation metrics 606. The aberration drift 608 may indicate a change of an aberration that would be caused by the deformation of the reticle 110 without one or more adjustments to one or more components of the exposure tool 100. The aberration drift 608 may indicate an amount of additional adjustment that may be made by the exposure tool 100 to correct for a change of the aberration that occurred during the scan 604 of the first field.

The exposure tool 100 may perform a scan 610 (e.g., an exposure) of a second field of the wafer 118. During the scan 610 of the second field and/or after the scan 610 of the second field, the exposure tool 100 obtains deformation metrics 612 associated with the reticle 110. The exposure tool 100 calculates an aberration drift 614 based on the deformation metrics 612. The aberration drift 614 may indicate an amount of additional adjustment that may be made by the exposure tool 100 to correct for a change of the aberration that occurred during the scan 610 of the second field.

The exposure tool 100 may perform a scan 616 (e.g., an exposure) of a third field of the wafer 118. During the scan 616 of the third field and/or after the scan 610 of the third field, the exposure tool 100 obtains deformation metrics 618 associated with the reticle 110. The exposure tool 100 calculates an aberration drift 620 based on the measurement of the deformation metrics 618. The aberration drift 620 may indicate an amount of additional adjustment that may be made by the exposure tool 100 to correct for a change of the aberration that occurred during the scan 616 of the third field.

In some implementations, the exposure tool 100 continues scanning fields of the wafer 118, obtaining deformation metrics during and/or between scans of the fields of the wafer 118, and/or calculating aberration drifts associated with the deformation metrics. In some implementations, the exposure tool 100 performs one or more adjustments to one or more components of the exposure tool 100 during the scanning process (e.g., during scans and/or between scans) based on the aberration drifts, as described herein.

As indicated above, FIG. 6 is provided as an example. Other examples may differ from what is described with regard to FIG. 6.

Figure 7:
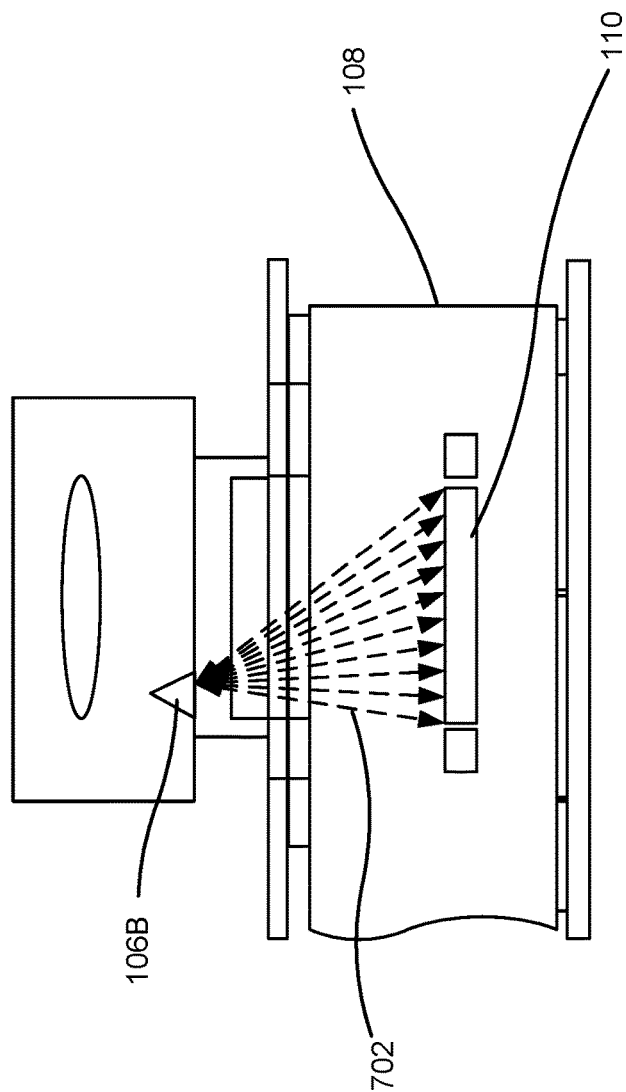
FIG. 7 is a diagram of an example of an exposure tool described in connection with the exposure tool of FIG. 1.

FIG. 7 is a diagram of an example 700 of a portion of an exposure tool described in connection with the exposure tool of FIG. 1. As shown by example 700, the reticle deformation detector 106 may include an electromagnetic wave-based scanner 106B configured to measure a deformation of a reticle 110 during a scanning process. The electromagnetic wave-based scanner 106B may include, for example, a laser and a sensor. In some implementations, the laser is configured to emit light at a surface of the reticle 110 and the sensor is configured to measure optical path lengths 702 of light that reflects off of the reticle 110. In some implementations, the electromagnetic wave-based scanner 106B includes multiple lasers and/or multiple sensors to measure the deformation of the reticle 110 during the scanning process.

The exposure tool 100 may determine thicknesses of one or more portions of the reticle 110 during the scanning process based on the optical path lengths 702. The exposure tool 100 may determine the deformation of the reticle 110 based on the thicknesses of the one or more portions of the reticle. For example, the exposure tool 100 may determine (e.g., estimate) the deformation of the reticle 110 based on a thickness of a center portion of the reticle 110. Additionally, or alternatively, the exposure tool 100 may determine the deformation of the reticle 110 based on thicknesses of the reticle 110 at multiple locations. In this way, the exposure tool 100 may determine an asymmetrical deformation of the reticle 110. Based on determining an asymmetrical deformation of the reticle 110, the exposure tool 100 may improve correction of the deformation based on applying one or more adjustments of one or more components of the exposure tool 100 (e.g., rotation of the projection lens 114, and/or offsetting of the projection lens housing 112 relative to the field, among other examples).

In some implementations, the electromagnetic wave-based scanner 106B is positioned on, or adjacent to, the scanning component 102 that is configured to direct light through the reticle 110 and toward the wafer 118. For example, the electromagnetic wave-based scanner 106B may be disposed on, or adjacent to, an optical element 104 of the scanning component 102. Additionally, or alternatively, the electromagnetic wave-based scanner 106B may be substantially aligned with a scanning direction of the scanning component 102 (e.g., a direction of a flow of light toward the wafer 118).

The electromagnetic wave-based scanner 106B may measure optical path lengths once or multiple times during a scan of a field of the wafer 118. Multiple measurements may improve a deformation determination and/or correction of aberrations; however, each measurement of optical paths via the electromagnetic wave-based scanner 106B may increase deformation of the reticle (e.g., based on absorbing energy from the laser).

The exposure tool 100 may determine an aberration drift based on the deformation of the reticle 110 as measured by the electromagnetic wave-based scanner 106B. The aberration drift may indicate change of an aberration (e.g., based on the deformation of the reticle) that has occurred since a previous measurement and/or since a previous adjustment to the one or more components of the exposure tool 100. The exposure tool 100 determines one or more modifications to apply to the one or more components of the exposure tool 100 to compensate for the aberration drift.

As indicated above, FIG. 7 is provided as an example. Other examples may differ from what is described with regard to FIG. 7.

Figure 8:
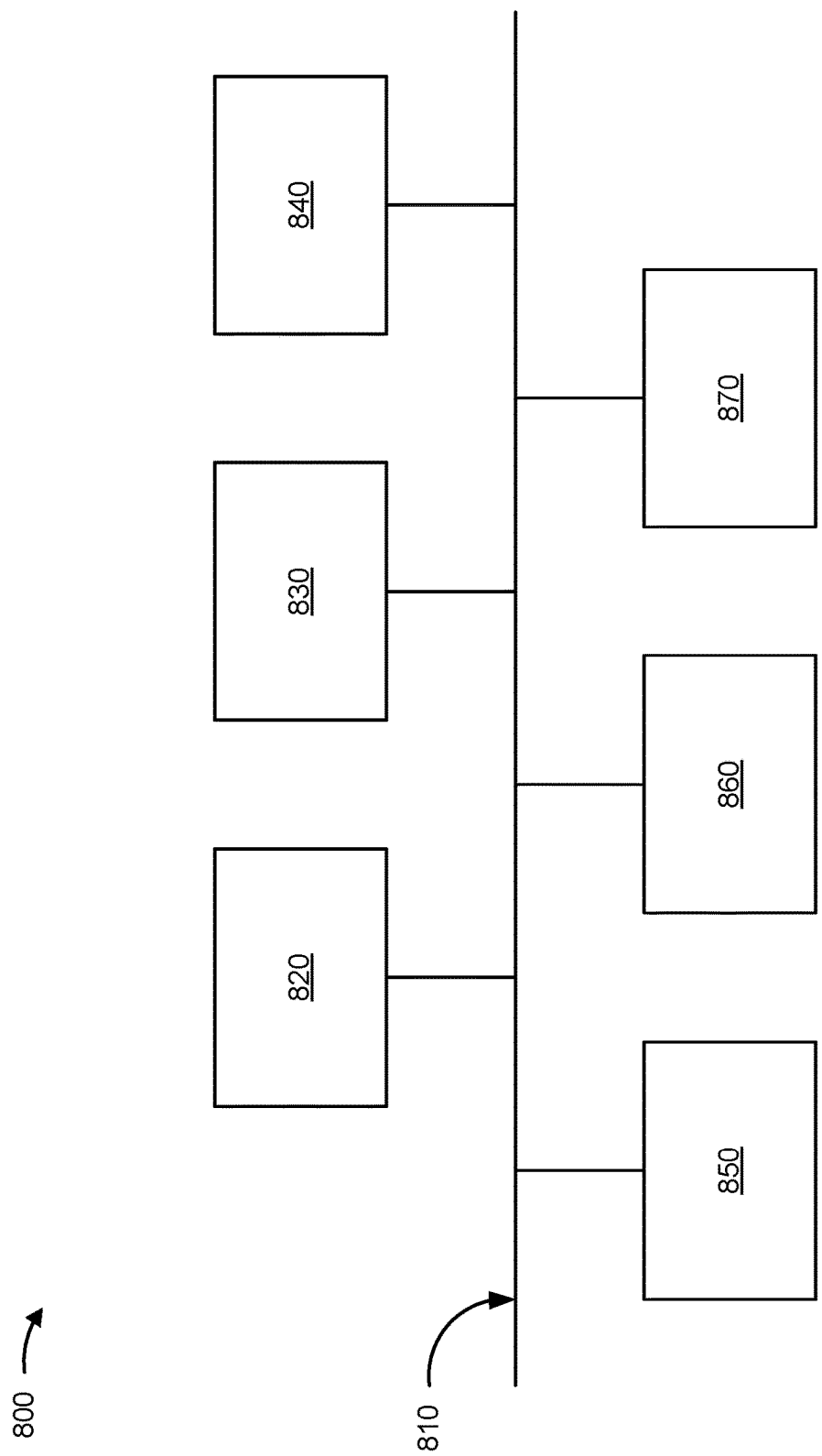
FIG. 8 is a diagram of example components of one or more devices of FIG. 1.

FIG. 8 is a diagram of example components of a device 800, which may correspond to exposure tool 100. In some implementations, the exposure tool 100 may include one or more devices 800 and/or one or more components of device 800. As shown in FIG. 8, device 800 may include a bus 810, a processor 820, a memory 830, a storage component 840, an input component 850, an output component 860, and a communication component 870.

Bus 810 includes a component that enables wired and/or wireless communication among the components of device 800. Processor 820 includes a central processing unit, a graphics processing unit, a microprocessor, a controller, a microcontroller, a digital signal processor, a field-programmable gate array, an application-specific integrated circuit, and/or another type of processing component. Processor 820 is implemented in hardware, firmware, or a combination of hardware and software. In some implementations, processor 820 includes one or more processors capable of being programmed to perform a function. Memory 830 includes a random access memory, a read only memory, and/or another type of memory (e.g., a flash memory, a magnetic memory, and/or an optical memory).

Storage component 840 stores information and/or software related to the operation of device 800. For example, storage component 840 may include a hard disk drive, a magnetic disk drive, an optical disk drive, a solid state disk drive, a compact disc, a digital versatile disc, and/or another type of non-transitory computer-readable medium. Input component 850 enables device 800 to receive input, such as user input and/or sensed inputs. For example, input component 850 may include a touch screen, a keyboard, a keypad, a mouse, a button, a microphone, a switch, a sensor, a global positioning system component, an accelerometer, a gyroscope, and/or an actuator. Output component 860 enables device 800 to provide output, such as via a display, a speaker, and/or one or more light-emitting diodes. Communication component 870 enables device 800 to communicate with other devices, such as via a wired connection and/or a wireless connection. For example, communication component 870 may include a receiver, a transmitter, a transceiver, a modem, a network interface card, and/or an antenna.

Device 800 may perform one or more processes described herein. For example, a non-transitory computer-readable medium (e.g., memory 830 and/or storage component 840) may store a set of instructions (e.g., one or more instructions, code, software code, and/or program code) for execution by processor 820. Processor 820 may execute the set of instructions to perform one or more processes described herein. In some implementations, execution of the set of instructions, by one or more processors 820, causes the one or more processors 820 and/or the device 800 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 8 are provided as an example. Device 800 may include additional components, fewer components, different components, or differently arranged components than those shown in FIG. 8. Additionally, or alternatively, a set of components (e.g., one or more components) of device 800 may perform one or more functions described as being performed by another set of components of device 800.

Figure 9:
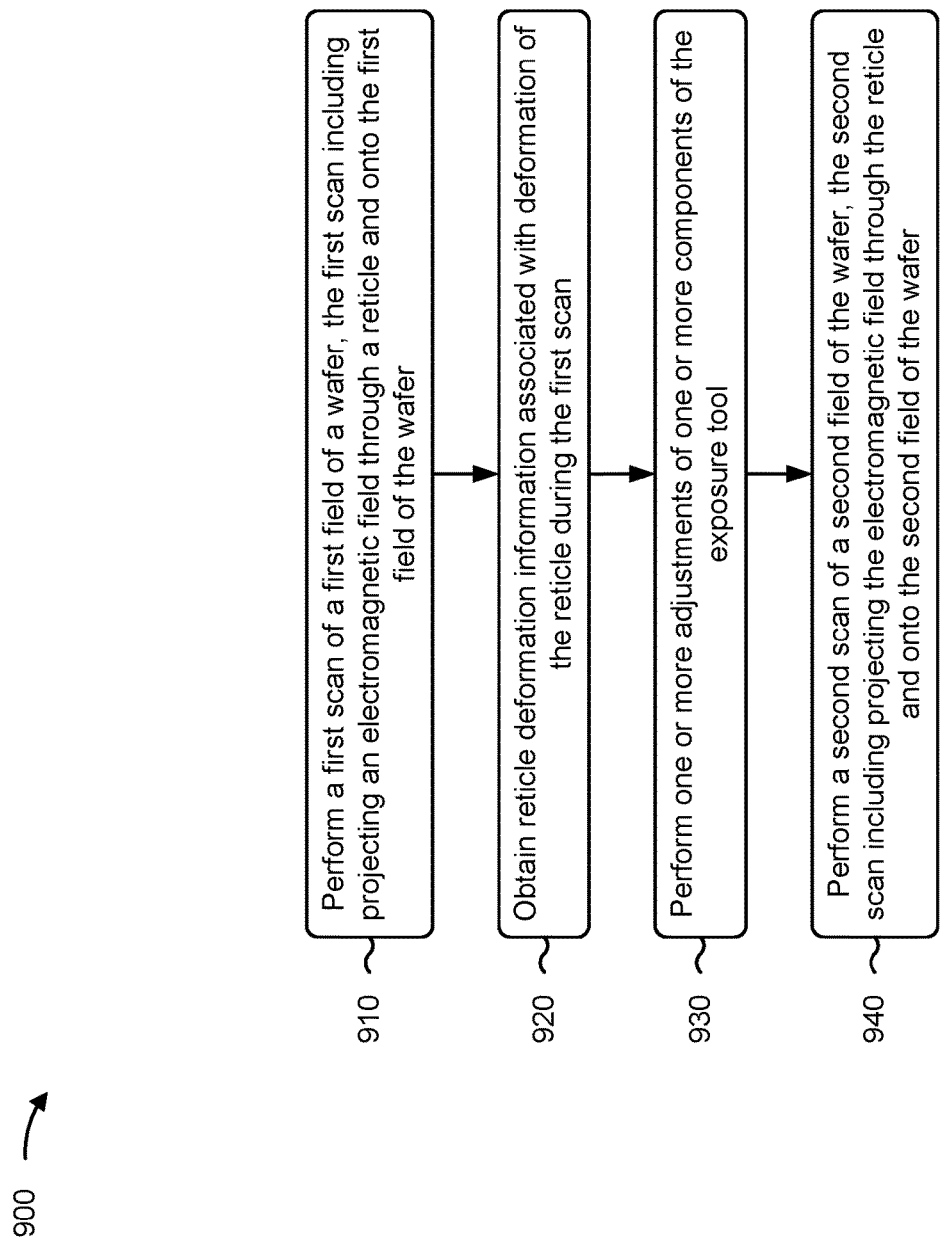
FIG. 9 is a flowchart of an example process relating to correction of aberrations.

FIG. 9 is a flowchart of an example process 900 relating to correction of aberrations. In some implementations, one or more process blocks of FIG. 9 may be performed by an exposure tool (e.g., exposure tool 100). Additionally, or alternatively, one or more process blocks of FIG. 9 may be performed by one or more components of device 800, such as processor 820, memory 830, storage component 840, input component 850, output component 860, and/or communication component 870.

As shown in FIG. 9, process 900 may include performing a first scan of a first field of a wafer (block 910). For example, the exposure tool 100 may perform a first scan of a first field 302 of a wafer 118, the first scan including projecting an electromagnetic field through a reticle 110 and onto the first field 302 of the wafer 118, as described above.

As further shown in FIG. 9, process 900 may include obtaining reticle deformation information associated with deformation of the reticle 110 during the first scan (block 920). For example, the exposure tool 100 may obtain deformation metrics associated with deformation of the reticle 110 during the first scan, as described above.

As further shown in FIG. 9, process 900 may include performing, based on the reticle deformation information, one or more adjustments of one or more components of the exposure tool (block 930). For example, the exposure tool 100 may perform, based on the deformation metrics, one or more adjustments of one or more components 108, 112, 114 of the exposure tool 100, as described above.

As further shown in FIG. 9, process 900 may include performing, after performing the one or more adjustments of the one or more components of the exposure tool, a second scan of a second field of the wafer, the second scan including projecting the electromagnetic field through the reticle and onto the second field of the wafer (block 940). For example, the exposure tool 100 may perform, after performing the one or more adjustments of the one or more components of the exposure tool 100, a second scan of a second field 302 of the wafer 118, the second scan including projecting the electromagnetic field through the reticle 110 and onto the second field 302 of the wafer 118, as described above.

Process 900 may include additional implementations, such as any single implementation or any combination of implementations described below and/or in connection with one or more other processes described elsewhere herein.

In a first implementation, performing the one or more adjustments of the one or more components of the exposure tool comprises one or more of adjusting the one or more components 108, 112, 114 of the exposure tool 100 during the first scan, adjusting the one or more components 108, 112, 114 of the exposure tool 100 before the second scan, or adjusting the one or more components 108, 112, 114 of the exposure tool 100 during the second scan.

In a second implementation, alone or in combination with the first implementation, obtaining the reticle deformation information comprises detecting a temperature of the reticle 110 during the first scan, or measuring the deformation of the reticle 110 using an electromagnetic wave-based scanner 106B.

In a third implementation, alone or in combination with one or more of the first and second implementations, process 900 includes obtaining, by the reticle deformation detector 106, additional reticle deformation information associated with the deformation of the reticle 110 during the second scan, and performing, based on the additional reticle deformation information, one or more adjustments of one or more components 108, 112, 114 of the exposure tool 100.

In a fourth implementation, alone or in combination with one or more of the first through third implementations, performing the one or more adjustments of the one or more components 108, 112, 114 of the exposure tool 100 comprises one or more of replacing the reticle 110 with a replacement reticle 110 based on the deformation of the reticle 110, or adjusting a projection lens 114 of the exposure tool 100.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

Based on determining a deformation of a reticle during a scanning process for scanning multiple fields of a wafer (e.g., instead of determining a deformation of the reticle only after scanning all fields of a wafer and before an additional scanning process for scanning multiple fields of a subsequent wafer), and making one or more adjustments of one or more components of an exposure tool during the scanning process, the exposure tool may reduce aberrations that would otherwise be caused by the deformation of the reticle. In this way, the exposure tool may be used to form structures having a reduced processing window based on, for example, having reduced dimensions (e.g., in a lateral direction). This may allow for the exposure tool to be used to form devices on the wafer with an improved device density.

As described in greater detail above, some implementations described herein provide an exposure tool. The exposure tool includes a reticle deformation detector and one or more processors configured, obtain, via the reticle deformation detector, reticle deformation information associated with a reticle, at multiple instances during a scanning process that includes scanning multiple fields of a wafer. The one or more processors determine, based on the reticle deformation information, a deformation of the reticle at multiple instances during the scanning process, and perform, based on the deformation of the reticle at the multiple instances, one or more adjustments of one or more components of the exposure tool at multiple times during the scanning process.

As described in greater detail above, some implementations described herein provide a method. The method includes performing, by an exposure tool, a first scan of a first field of a wafer, where the first scan includes projecting an electromagnetic field through a reticle and onto the first field of the wafer. The method includes obtaining, by a reticle deformation detector, reticle deformation information associated with deformation of the reticle during the first scan. The method includes performing, based on the reticle deformation information, one or more adjustments of one or more components of the exposure tool. The method includes performing, by the exposure tool and after performing the one or more adjustments of the one or more components of the exposure tool, a second scan of a second field of the wafer, where the second scan includes projecting the electromagnetic field through the reticle and onto the second field of the wafer.

As described in greater detail above, some implementations described herein provide an exposure tool. The exposure tool includes a scanning component configured to perform a scanning process that comprises directing light through a reticle and toward a wafer. The exposure tool includes a reticle deformation detector configured to obtain reticle deformation information, at multiple instances of the scanning process, associated with scans of different fields of the wafer during the scanning process. The exposure tool includes a projection lens that is configured to be adjusted during the scanning process based on the reticle deformation information associated with the scans of the different fields of the wafer during the scanning process. The exposure tool includes a reticle housing configured to position the reticle between the scanning component and the projection lens.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An exposure tool comprising:
a reticle deformation detector comprising a reticle temperature sensor; and
one or more processors configured to:
obtain, via the reticle deformation detector, reticle deformation information, associated with a reticle and including a temperature of the reticle, during a scanning process of a wafer,
determine, based on the reticle deformation information, an aberration drift of the reticle during the scanning process, wherein the aberration drift indicates a change of an aberration of the reticle that would be caused by a deformation of the reticle without one or more adjustments, of one or more components of the exposure tool, in addition to one or more initial adjustments, of the one or more components of the exposure tool, associated with the aberration of the reticle, and
perform, based on the aberration drift, the one or more adjustments of the one or more components of the exposure tool.

2. The exposure tool of claim 1, wherein the one or more processors, to perform the one or more adjustments of the one or more components of the exposure tool, are configured to cause one or more of:
the reticle to be replaced with a replacement reticle based on the deformation of the reticle, or
a projection lens of the exposure tool to be adjusted.

3. The exposure tool of claim 1, wherein the one or more processors, to perform the one or more adjustments of the one or more components of the exposure tool, are configured to:
perform the one or more adjustments of the one or more components of the exposure tool between a first scan of a first field of the wafer and a second scan of a second field of the wafer, or
perform the one or more adjustments of the one or more components of the exposure tool during the first scan of the first field of the wafer.

4. The exposure tool of claim 1, wherein the one or more processors are configured to:
estimate a deformation of the reticle based on the temperature of the reticle during the scanning process.

5. The exposure tool of claim 1, wherein the one or more processors, to determine the aberration drift, are configured to:
  determine the aberration drift of the reticle during the scanning process based on a mapping of measured temperatures of the reticle to aberrations of the scanning process.

6. The exposure tool of claim 1, wherein the reticle temperature sensor is positioned on, or adjacent to, a scanning component configured to direct light through the reticle and toward the wafer, and
  wherein the reticle temperature sensor is substantially aligned with a scanning direction of the scanning component.

7. The exposure tool of claim 1, wherein the reticle temperature sensor comprises:
  a non-contact thermometer.

8. The exposure tool of claim 1, wherein the reticle deformation detector comprises an electromagnetic wave-based scanner configured to measure the deformation of the reticle.

9. The exposure tool of claim 8, wherein the electromagnetic wave-based scanner comprises a laser and a sensor,
  wherein the laser is configured to emit light at a surface of the reticle,
  wherein the sensor is configured to measure optical path lengths of light that reflects off of the reticle,
  wherein the one or more processors are configured to determine thicknesses of one or more portions of the reticle during the scanning process based on the optical path lengths of the light that reflects off of the reticle.

10. The exposure tool of claim 9, wherein the one or more processors are configured to:
  determine one or more modifications to apply to the one or more components of the exposure tool to compensate for the aberration drift.

11. The exposure tool of claim 1, wherein at least one of:
  the reticle deformation information was obtained at multiple instances during the scanning process, or
  the aberration drift was determined at the multiple instances during the scanning process.

12. The exposure tool of claim 1, wherein the reticle deformation information was obtained via scanning a field of a wafer.

13. A method, comprising:
  performing, by an exposure tool, a first scan of a first field of a wafer, the first scan including projecting an electromagnetic field through a reticle and onto the first field of the wafer;
  obtaining, by a reticle deformation detector comprising a reticle temperature sensor, reticle deformation information, associated with deformation of the reticle and including a temperature of the reticle, during the first scan;
  determining, based on the reticle deformation information, an aberration drift of the reticle, wherein the aberration drift indicates a change of an aberration that would be caused by a deformation of the reticle without one or more adjustments, of one or more components of the exposure tool, in addition to one or more initial adjustments, of the one or more components of the exposure tool, associated with the aberration of the reticle;
  performing, based on the aberration drift, the one or more adjustments of the one or more components of the exposure tool; and
  performing, by the exposure tool and after performing the one or more adjustments of the one or more components of the exposure tool, a second scan of a second field of the wafer, the second scan including projecting the electromagnetic field through the reticle and onto the second field of the wafer.

14. The method of claim 13, wherein performing the one or more adjustments of the one or more components of the exposure tool comprises one or more of:
  adjusting the one or more components of the exposure tool during the first scan,
  adjusting the one or more components of the exposure tool before the second scan, or
  adjusting the one or more components of the exposure tool during the second scan.

15. The method of claim 13, wherein obtaining the reticle deformation information comprises:
  detecting the temperature of the reticle during the first scan, or
  measuring the deformation of the reticle using an electromagnetic wave-based scanner.

16. The method of claim 13, further comprising:
  obtaining, by the reticle deformation detector, additional reticle deformation information associated with the deformation of the reticle during the second scan; and
  performing, based on the additional reticle deformation information, one or more additional adjustments of the one or more components of the exposure tool.

17. The method of claim 13, wherein performing the one or more adjustments of the one or more components of the exposure tool comprises one or more of:
  replacing the reticle with a replacement reticle based on the deformation of the reticle, or
  adjusting a projection lens of the exposure tool.

18. An exposure tool comprising:
  a scanning component configured to perform a scanning process that comprises directing light through a reticle and toward a wafer;
  a reticle deformation detector, comprising a reticle temperature sensor, configured to obtain reticle deformation information, comprising a temperature of the reticle, associated with scans of different fields of the wafer during the scanning process;
  a projection lens that is configured to be adjusted during the scanning process based on an aberration drift of the reticle that is associated with the reticle deformation information, wherein the aberration drift indicates a change of an aberration of the reticle that would be caused by a deformation of the reticle without one or more adjustments, of one or more components of the exposure tool, in addition to one or more initial adjustments, of the one or more components of the exposure tool, associated with the aberration of the reticle; and
  a reticle housing configured to position the reticle between the scanning component and the projection lens.

19. The exposure tool of claim 18, wherein the reticle deformation detector further comprising an electromagnetic wave-based scanner.

20. The exposure tool of claim 18, further comprising the reticle disposed in the reticle housing.

* * * * *